United States Patent
Lee et al.

(10) Patent No.: US 8,284,337 B2
(45) Date of Patent: Oct. 9, 2012

(54) DISPLAY APPARATUS WITH STORAGE ELECTRODE LINE HAVING DIFFERENT WIDTHS AND MANUFACTURING METHOD THEREOF

(75) Inventors: Bong-Jun Lee, Seoul (KR); Kyung-Wook Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 318 days.

(21) Appl. No.: 12/637,943

(22) Filed: Dec. 15, 2009

(65) Prior Publication Data

US 2010/0157234 A1 Jun. 24, 2010

(30) Foreign Application Priority Data

Dec. 24, 2008 (KR) .................. 10-2008-0133651

(51) Int. Cl.
*G02F 1/1343* (2006.01)
*G02F 1/136* (2006.01)
*G09G 3/36* (2006.01)
*H01L 29/15* (2006.01)
*H01L 31/036* (2006.01)

(52) U.S. Cl. ............. 349/38; 349/39; 349/42; 349/43; 345/92; 257/59; 257/72

(58) Field of Classification Search ............. 349/38–39, 349/42–43, 149–152; 345/92, 104; 257/59, 257/72
See application file for complete search history.

(56) References Cited

U.S. PATENT DOCUMENTS

| | | | | |
|---|---|---|---|---|
| 6,621,537 B1 * | 9/2003 | Nakamura et al. | ............. | 349/43 |
| 7,700,948 B2 * | 4/2010 | Kim et al. | ............. | 257/59 |
| RE41,426 E * | 7/2010 | Park et al. | ............. | 257/72 |
| 2006/0227095 A1 * | 10/2006 | Kim et al. | ............. | 345/100 |
| 2008/0062108 A1 * | 3/2008 | Kim | ............. | 345/92 |
| 2009/0086116 A1 * | 4/2009 | Pak | ............. | 349/38 |

* cited by examiner

*Primary Examiner* — Hoan C Nguyen
(74) *Attorney, Agent, or Firm* — Cantor Colburn LLP

(57) ABSTRACT

A display apparatus includes a thin film transistor array panel including a display region and a non-display region, a gate line extending along a first direction, a data line extending along a second direction, substantially perpendicular to the first direction, the data line being insulated from and crossing the gate line, a storage electrode line which receives a common voltage signal, and a first gate driver disposed on the thin film transistor array panel and which supplies at least one of a gate on signal and a gate off signal to the gate line. The storage electrode line includes a first portion extending along the first direction and a second portion extending along the second direction in the non-display region. A width, measured along the second direction, of the first portion is less than a width, measured along the first direction, of the second portion.

20 Claims, 3 Drawing Sheets

DISPLAY APPARATUS WITH STORAGE ELECTRODE LINE HAVING DIFFERENT WIDTHS AND MANUFACTURING METHOD THEREOF

This application claims priority to Korean Patent Application No. 10-2008-0133651, filed on Dec. 24, 2008, and all the benefits accruing therefrom under 35 U.S.C. §119, the content of which in its entirety is herein incorporated by reference.

BACKGROUND OF THE INVENTION

1. Field of the Invention

The present invention relates to a display apparatus and a manufacturing method thereof. More particularly, the present invention relates to a display apparatus having substantially reduced power consumption and improved display quality, and a method of manufacturing the same.

2. Description of the Related Art

A display apparatus, such as a liquid crystal display ("LCD") device or an organic electroluminescence ("EL") display device, for example, typically includes a thin film transistor ("TFT") array panel, which is used as a circuit panel for driving pixels of the display apparatus. The TFT array panel includes a scanning signal line or wire (e.g., a gate line or wire), which transmits scanning signals, and a data line or wire, which transmits data signals. The TFT array panel further includes TFTs connected to the gate wire and the data wire and pixel electrodes connected to the TFTs. Additionally, a gate insulating layer is disposed on the gate wire to insulate the gate wire, and a passivation layer is disposed on the TFTs and the data wire to insulate the TFTs and the data wire. Each of the TFTs includes a gate electrode, which is a portion of the gate wire, a semiconductor layer, which forms a channel of the TFT, a source electrode, which is a portion of the data wire, and a drain electrode, which is connected to the pixel electrode and transmits a data signal to the pixel electrode from the data wire via the TFT. The TFTs, generally speaking, are switching elements that transmit the data signals to the pixel electrodes from the data wire in response to the scanning signals received from the gate wire.

The TFT array panel typically further includes storage electrode lines, to which a common voltage signal is applied. However, operation of the display apparatus is adversely affected due to delay of the common voltage signal caused by electrical resistance of the storage electrode lines.

Thus, there is a need for a TFT array panel having storage electrode lines with reduced electrical resistance.

BRIEF SUMMARY OF THE INVENTION

Exemplary embodiments of present invention provide a display apparatus having advantages that include, but are not limited to, substantially reduced electrical resistances of storage electrode lines in a thin film transistor ("TFT") panel thereof.

In an exemplary embodiment of the present invention, a display apparatus includes a TFT array panel including a display region and a non-display region, a gate line extending along a first direction, a data line extending along a second direction, substantially perpendicular to the first direction, insulated from and crossing over the gate lines, a storage electrode line which receives a common voltage signal, a first gate driver disposed on the array panel and which supplies at least one of a gate on signal and a gate off signal to the gate line. The storage electrode line includes a first portion extending along the first direction, and a second portion extending along the second direction in the non-display region. A width (measured along the second direction) of the first portion is less than a width (measured along the first direction) of the second portion.

The gate driver is directly disposed on the array panel.

The first portion and the second portion are made of a same metal.

The display apparatus further includes a plurality of gate lines, and the first gate driver is connected to all gate lines of the plurality of gate lines.

The display apparatus may further include a second gate driver, and the first gate driver and the second gate driver may both be connected to the gate line.

The display apparatus may further include a plurality of gate lines including a first gate line and a second gate line adjacent to the first gate line, and a second gate driver. The first gate driver is connected to the first gate line and supplies at least one of a gate on signal and a gate off signal thereto, while the second gate driver is connected to the second gate line and supplies at least one of a gate on signal and a gate off signal thereto. A phase of the at least one of the gate on signal and the gate off signal supplied to the first gate line from the first gate driver is different from a phase of the at least one of the gate on signal and the gate off signal supplied to the second gate line from the second gate driver.

The display apparatus may further include an output node of the first gate driver, which extends along the first direction from the first gate driver, crosses over and is insulated from the second portion of the storage electrode line.

The output node is connected to the gate line by a pixel electrode pattern.

In an alternative exemplary embodiment of the present invention, a method of manufacturing a display apparatus includes: forming a thin film transistor array panel including a display region and a non-display region; forming a gate line extending along a first direction on the thin film transistor array panel; forming a data line extending along a second direction, substantially perpendicular to the first direction, insulated from and crossing the gate line on the thin film transistor array panel; forming a storage electrode line which receives a common voltage signal on the thin film transistor array panel; and forming a first gate driver on the thin film transistor array panel, the first gate driver configured to supply at least one of a gate on signal and a gate off signal to the gate line. The forming the storage electrode line includes extending a first portion of the storage electrode line along the first direction, and extending a second portion of the storage electrode line along the second direction in the non-display region. A width (measured along the second direction) of the first portion is less than a width (measured along the first direction) of the second portion.

The forming the first gate driver comprises directly forming the first gate driver on the TFT array panel.

The first portion and the second portion are formed of a same metal.

The method may further include forming a plurality of gate lines and connecting the first gate driver to all gate lines of the plurality of gate lines.

The method may further include forming a second gate driver and connecting both the first gate driver and the second gate driver to the gate line.

The method may further include: forming a plurality of gate lines including a first gate line and a second gate line adjacent to the first gate line; forming a second gate driver; connecting the first gate driver to the first gate line; and connecting the second gate driver to the second gate line. The first gate driver and the second gate driver are configured such that a phase of at least one of a gate on signal and a gate off signal supplied to the first gate line from the first gate driver is different from a phase of at least one of a gate on signal and a gate off signal supplied to the second gate line from the second gate driver.

The method may further include forming an output node of the first gate driver, wherein the output node extends along the first direction from the first gate driver, crosses over and is insulated from the second portion of the storage electrode line.

The method may further include connecting the output node to the gate line by a pixel electrode pattern.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
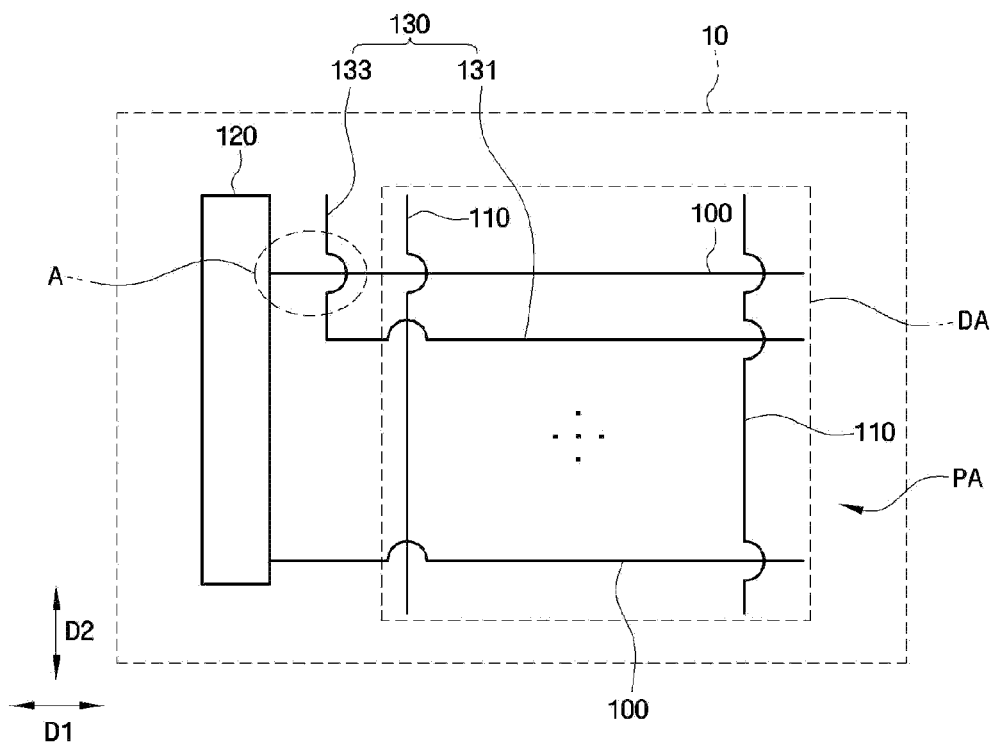
FIG. 1 is a plan view of an exemplary embodiment of a thin film transistor ("TFT") array panel according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

FIG. 1 is a plan view of a thin film transistor ("TFT") array panel 10 according to an exemplary embodiment of the present invention.

Referring to FIG. 1, the TFT array panel 10 is divided into a display region DA and a non-display region, e.g., a peripheral region PA. Gate lines 100 extend along a first direction D1 (e.g., a longitudinal direction as viewed in FIG. 1) of the TFT array panel 10, and data lines 110 insulated from and crossing the gate lines 100, extend along a second direction D2 (e.g., a transverse direction as viewed in FIG. 1), which is substantially perpendicular to the first direction D1 of the TFT array panel 10. In an exemplary embodiment, the data lines 110 extending along the second direction are disposed on an insulating substrate (not shown). A TFT (FIG. 2) is connected to each of the gate lines 100 and the data lines 110 on the TFT array panel 10, as will now be described in further detail with reference to FIG. 2, which is a partial cross-sectional view of an exemplary embodiment of the TFT array panel 10 according to the present invention.

Figure 2:
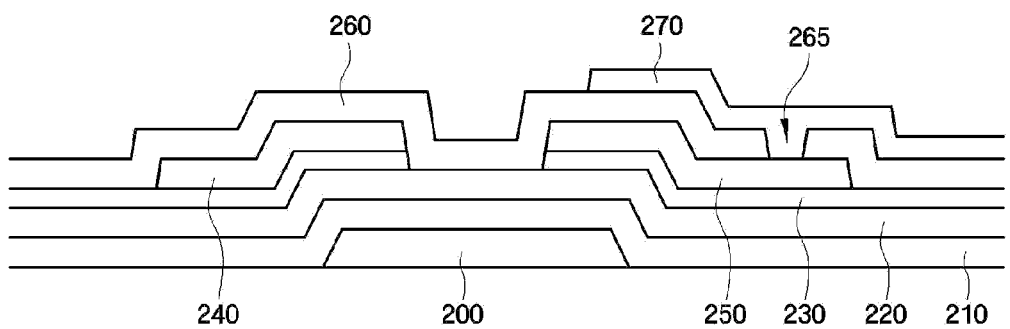
FIG. 2 is a partial cross-sectional sectional view of an exemplary embodiment of a TFT array panel according to the present invention.

Referring to FIG. 2, each of the TFTs includes a gate electrode 200 disposed on the insulating substrate (not shown). An insulating layer pattern 210 is disposed on the gate electrode 200. A semiconductor film pattern 220 is disposed on the insulating layer pattern 210 and over the gate electrode 200. An impurity doped semiconductor film pattern 230 is disposed on at least a portion of the semiconductor film pattern 220. In an exemplary embodiment, the impurity doped semiconductor film pattern 230 contacts an upper surface (as viewed in FIG. 2) of the semiconductor film pattern 220, and the impurity doped semiconductor film pattern 230 is separated over the gate electrode 200 to expose a portion of the semiconductor film pattern 220 disposed above the gate electrode 200, as shown in FIG. 2. A source electrode 240 and a drain electrode 250 are disposed over respective portions of the impurity doped semiconductor film pattern 230 on opposite sides of the gate electrode 200, with the exposed portion of the semiconductor film pattern 220 disposed therebetween to form the TFT.

A protection film pattern 260 is disposed on the source electrode 240 and the drain electrode 250, and the protection film pattern 260 has a contact hole 265 formed therein over the drain electrode 250. A pixel electrode pattern 270 is electrically connected to the drain electrode 250, which is exposed through the protection film pattern 260 via the contact hole 265.

Referring again to FIG. 1, a gate driver 120 is directly disposed on the TFT array panel 10 and is connected to the gate lines 100. In an exemplary embodiment, the gate driver 120 includes stages (not shown) connected to the gate lines 100. More particularly, in an exemplary embodiment, the gate driver 120 is a shift register including the stages.

During operation of the display apparatus, the gate driver 120 sequentially supplies a gate on signal and a gate off signal to each of the gate lines 100. Each stage of the gate driver 120 includes TFTs, and outputs the gate on signal and gate off signal by turning on or turning off the TFTs therein.

A storage electrode line 130 is disposed on the TFT array substrate 10. In an exemplary embodiment, the storage electrode line 130 includes a first portion 131, extending along the first direction D1, disposed between adjacent gate lines 100 and insulated from the gate lines 100, but alternative exemplary embodiments are not limited thereto. For example, a location of the storage electrode line 130 is not limited to between every two adjacent gate lines 100 in an alternative exemplary embodiment.

A second portion 133 of the storage electrode line 130 extends along the second direction in the non-display region PA. An end portion of the second portion 133 receives a common voltage signal from an external circuit (not shown).

Figure 3:
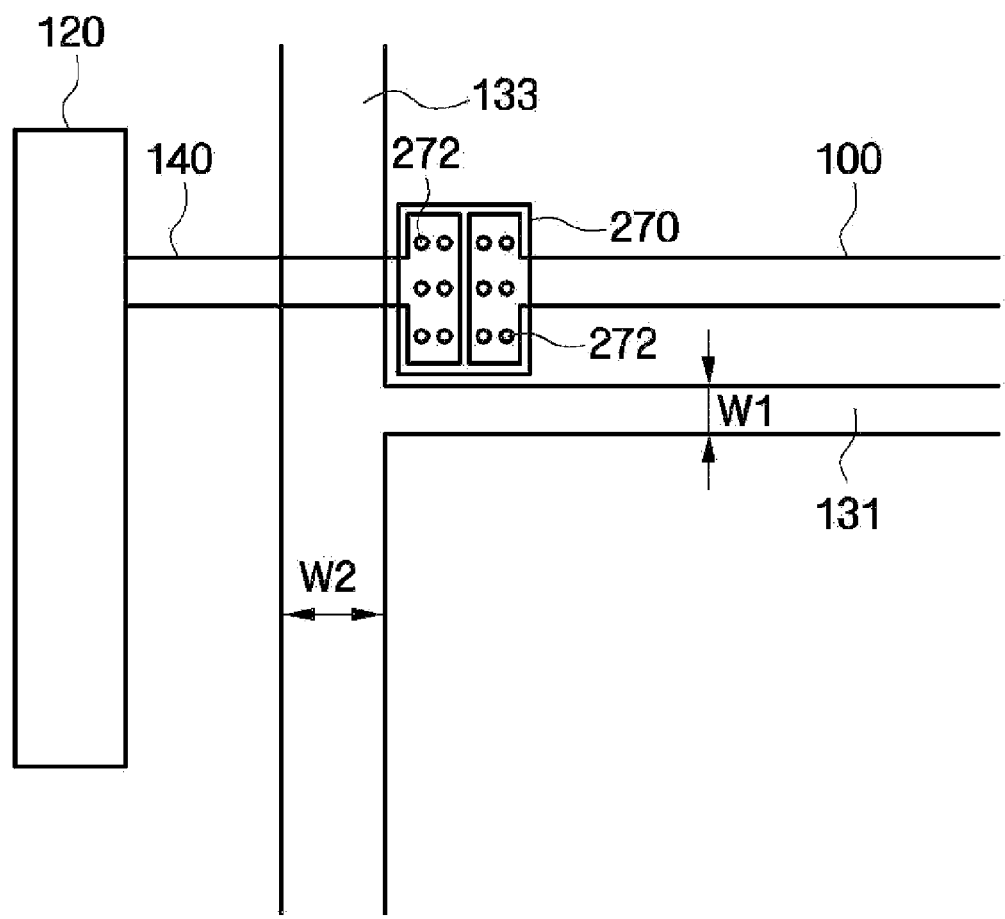
FIG. 3 is an enlarged view of portion "A" in FIG. 1.

FIG. 3 is an enlarged view of portion "A" in FIG. 1.

Referring now to FIG. 3, the storage electrode line 130 may be made of a same metal used for making the gate lines 100. As shown in FIG. 3, a width W1 of the first portion 131 (hereinafter referred to as "a first width W1") measured in the second direction D2 is less than a width W2 of the second portion 133 (hereinafter referred to as "a second width W2") measured in the first direction D1.

An electrical resistance of a particular portion of the storage electrode line 130 is related to, among other things, a width thereof. Specifically, as the width of the storage electrode line 130 increases, the electrical resistance (hereinafter, simply "resistance") decreases. Thus, increasing the width of the storage electrode line 130 reduces a delay of the common voltage signal.

Still referring to FIG. 3, the first width W1 of the first portion 131 extending along the first direction D1 affects an aperture ratio of the display apparatus. Specifically, as the first width W1 increases, the aperture ratio decreases. Accordingly, in an exemplary embodiment, the first width W1 is not the same as the second width W2 of the second portion 133 in the non-display region PA. More particularly, in an exemplary embodiment, the first width W1 is less than the second width W2, as described above and shown in FIG. 3. As a result, the aperture ration of the display apparatus according to an exemplary embodiment is substantially improved, since the second width W2, which is wider than the first width W1, is in the non-display region PA.

An output node 140 of each stage (not shown) of the gate driver 120 is connected to each of the gate lines 100 to supply the gate on signal and gate off signal thereto, as shown in FIG. 3. In an exemplary embodiment, the output node 140 is made of the same metal used for making the drain electrode 250 (FIG. 2). However, the output node 140 and the gate lines 100 may be made of different metals. As a result, a connector is used to connect them, as will now be described in greater detail with reference to FIGS. 2 and 3.

In an exemplary embodiment of present invention, the pixel electrode pattern 270 connects the output node 140 and the gate lines 100. More specifically, the output node 140 of each stage of the gate driver 120 is covered with the protection film pattern 260 (FIG. 2). The gate lines 100 are covered with the insulating layer pattern 210 and the protection film pattern 260 (FIG. 2). Thus, the protection film pattern 260 and the insulating layer pattern 210 covering the gate line 100 and the output node 140 have a contact hole 272 (FIG. 3) formed therein to connect the gate line 100 and the output node 140 via the pixel electrode pattern 270. Thus, the pixel electrode pattern 270 is connected to the output node 140 and gate line 100 through the contact hole 272. It will be noted that, as shown in FIG. 3, the output node 140 of each stage of the gate driver 120 crosses the second portion 133 of the storage electrode line 130, as shown in FIG. 3.

Figure 4:
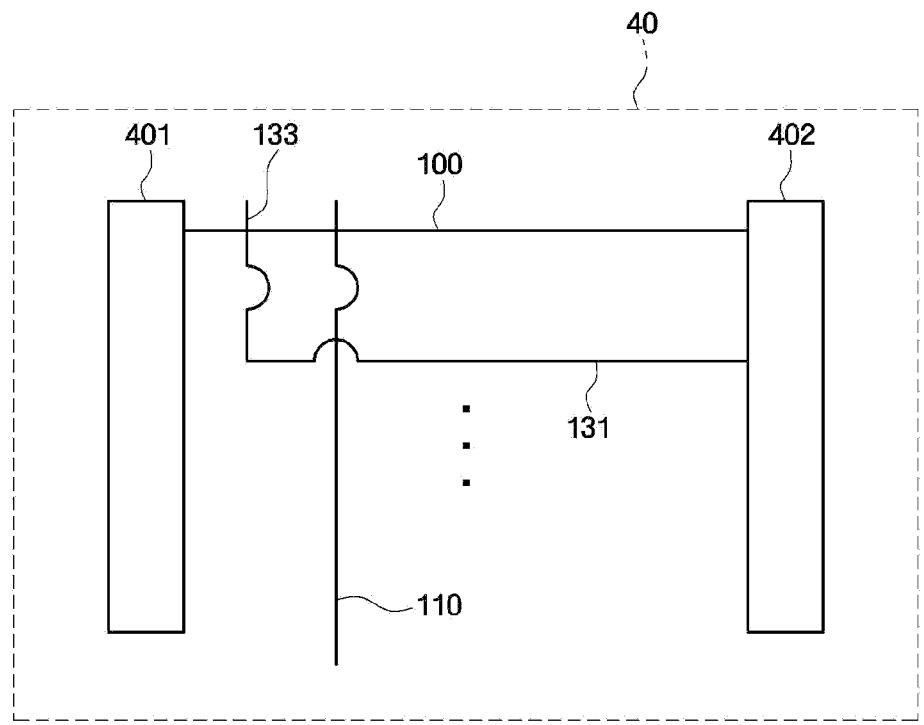
FIG. 4 is a plan view of an alternative exemplary embodiment of a TFT array panel according to the present invention.

FIG. 4 is a plan view of an alternative exemplary embodiment of a TFT array panel 40 according to the present invention. The same or like elements shown in FIG. 4 are labeled with the same reference characters used in the alternative exemplary embodiments shown in FIGS. 1-3 and described in further detail above with reference thereto. Thus, any repetitive detailed description thereof will hereinafter be simplified or omitted.

In an alternative exemplary embodiment, the TFT array panel 40 includes a plurality of gate drivers disposed directly on the TFT array panel 40. Specifically, the plurality of gate drivers includes a first gate driver 401 and second gate driver 402, which are both connected to each of the gate lines 100, as shown in FIG. 4. More specifically, each stage, e.g., an N-th stage (not shown) of the first gate driver 401, and an N-th stage (not shown) of the second gate driver 402, are connected to a same gate line 100. As a result, a delay of the gate on signal and the gate off signal, received by the gate line 100 from the first gate driver 401 and the second gate driver 402, is substantially reduced.

Connections between the output node 140 (FIG. 3) of each stage of the first gate driver 401 and the second gate driver 402 and the gate lines 100 is substantially the same as described in greater detail above with reference to FIGS. 1-3.

Figure 5:
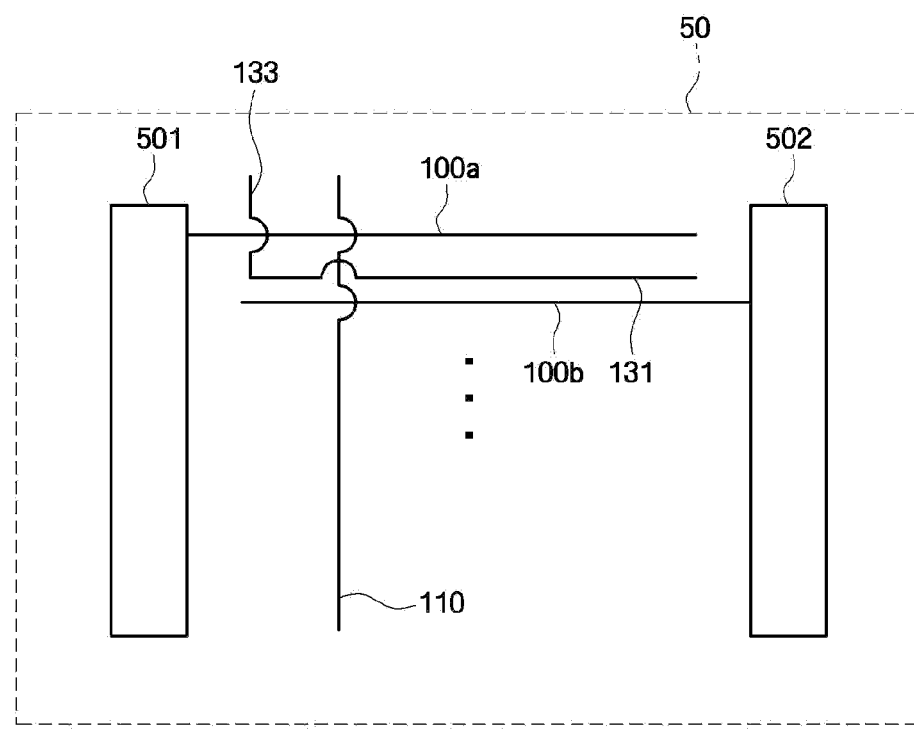
FIG. 5 is a plan view of another alternative exemplary embodiment of a TFT array panel according to the present invention.

FIG. 5 is a plan view of another alternative exemplary embodiment of a TFT array panel 50 according to the present invention. The same or like elements shown in FIG. 5 are labeled with the same reference characters used in the alternative exemplary embodiments shown in FIGS. 1-4 and described in further detail above with reference thereto. Thus, any repetitive detailed description thereof will hereinafter be simplified or omitted.

A plurality of gate drivers is directly disposed on the TFT array panel 50. Specifically, a first gate driver 501 and a second gate driver 502 are directly disposed on the TFT array panel and are connected to different gate lines, as shown in FIG. 5. Specifically, for example, an N-th stage of the first gate driver 501 and an N-th stage of the second gate driver 502 are connected to different adjacent gate lines. More specifically, the first gate driver 501 is connected to a first gate line 100a, while the second gate driver 502 is connected to a second gate line 100b, which is adjacent to the first gate line 100a, as shown in FIG. 5. In an exemplary embodiment, the gate on signal and gate off signal of the first gate driver 501 have different phases from phases of the gate ON signal and the gate OFF signal of the second gate driver 502.

Thus, according to exemplary embodiments of the present invention as described herein, a display apparatus, such as a liquid crystal display ("LCD"), for example, has a substantially improved display quality, since a delay of a common voltage signal in a storage electrode line of a TFT array panel is reduced by increasing a width of a first portion of a storage electrode line that is in a non-display region, thereby decreasing an electrical resistance of the same. In addition, a width of a second portion of the storage electrode line that is in a display region is not increased (relative to the width of the first portion), so that an aperture ratio of the LCD is improved. Additionally, output nodes of the gate driver are connected to the gate lines via a pixel electrode pattern.

The present invention should not be construed as being limited to the exemplary embodiments set forth herein. Rather, these exemplary embodiments are provided so that this disclosure will be thorough and complete and will fully convey the concept of the present invention to those skilled in the art.

For example, in yet another alternative exemplary embodiment, a method of manufacturing a display apparatus includes: forming a thin film transistor array panel including a display region and a non-display region; forming a gate line extending along a first direction on the thin film transistor array panel; forming a data line extending along a second direction, substantially perpendicular to the first direction, insulated from and crossing the gate line on the thin film transistor array panel; forming a storage electrode line which receives a common voltage signal on the thin film transistor array panel; and forming a first gate driver on the thin film transistor array panel, the first gate driver configured to supply at least one of a gate on signal and a gate off signal to the gate line. The forming the storage electrode line includes extending a first portion of the storage electrode line along the first direction, and extending a second portion of the storage electrode line along the second direction in the non-display region. A width (measured along the second direction) of the first portion is less than a width (measured along the first direction) of the second portion.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A display apparatus comprising:
a thin film transistor array panel including a display region and a non-display region;
a gate line extending along a first direction;
a data line extending along a second direction, substantially perpendicular to the first direction, insulated from and crossing the gate line;
a storage electrode line which receives a common voltage signal; and
a first gate driver disposed on the thin film transistor array panel and which supplies at least one of a gate on signal and a gate off signal to the gate line, wherein
the storage electrode line comprises:
a first portion extending along the first direction; and
a second portion extending along the second direction in the non-display region, and
a width, measured along the second direction, of the first portion is less than a width, measured along the first direction, of the second portion,
wherein the first portion and second portion are disposed in a same plane.

2. The display apparatus of claim 1, wherein the first gate driver is disposed directly on the array panel.

3. The display apparatus of claim 1, wherein the first portion and the second portion are made of a same metal.

4. The display apparatus of claim 1, further comprising a plurality of gate lines, wherein the first gate driver is connected to all gate lines of the plurality of gate lines.

5. The display apparatus of claim 1, further comprising a second gate driver, wherein the first gate driver and the second gate driver are both connected to the gate line.

6. The display apparatus of claim 1, further comprising:
a plurality of gate lines including a first gate line and a second gate line adjacent to the first gate line; and
a second gate driver, wherein
the first gate driver is connected to the first gate line and supplies at least one of a gate on signal and a gate off signal thereto,
the second gate driver is connected to the second gate line and supplies at least one of a gate on signal and a gate off signal thereto, and
a phase of the at least one of the gate on signal and the gate off signal supplied to the first gate line from the first gate driver is different from a phase of the at least one of the gate on signal and the gate off signal supplied to the second gate line from the second gate driver.

7. The display apparatus of claim 1, wherein an output node of the first gate driver, extending along the first direction from the first gate driver, crosses over and is insulated from the second portion of the storage electrode line.

8. The display apparatus of claim 7, wherein the output node is connected to the gate line by a pixel electrode pattern.

9. The display apparatus of claim 1, wherein the storage electrode line extends in the second direction only in the non-display region.

10. The display apparatus of claim 1, wherein the storage electrode line does not extend in the second direction in the display region.

11. A method of manufacturing a display apparatus, the method comprising:
forming a thin film transistor array panel including a display region and a non-display region;
forming a gate line extending along a first direction on the thin film transistor array panel;

forming a data line extending along a second direction, substantially perpendicular to the first direction, insulated from and crossing the gate line on the thin film transistor array panel;

forming a storage electrode line which receives a common voltage signal on the thin film transistor array panel; and forming a first gate driver on the thin film transistor array panel, the first gate driver configured to supply at least one of a gate on signal and a gate off signal to the gate line, wherein the forming the storage electrode line comprises:
    extending a first portion of the storage electrode line along the first direction; and
    extending a second portion of the storage electrode line along the second direction in the non-display region, and a width, measured along the second direction, of the first portion is less than a width, measured along the first direction, of the second portion, wherein the first portion and second portion are disposed in a same plane.

12. The method of claim 11, wherein the forming the first gate driver comprises directly forming the first gate driver on the TFT array panel.

13. The method of claim 11, wherein the first portion and the second portion are formed of a same metal.

14. The method of claim 11, further comprising:
forming a plurality of gate lines; and
connecting the first gate driver to all gate lines of the plurality of gate lines.

15. The method of claim 11, further comprising:
forming a second gate driver; and
connecting both the first gate driver and the second gate driver to the gate line.

16. The method of claim 11, further comprising:
forming a plurality of gate lines including a first gate line and a second gate line adjacent to the first gate line;
forming a second gate driver;
connecting the first gate driver to the first gate line; and
connecting the second gate driver to the second gate line, wherein the first gate driver and the second gate driver are configured such that a phase of at least one of a gate on signal and a gate off signal supplied to the first gate line from the first gate driver is different from a phase of at least one of a gate on signal and a gate off signal supplied to the second gate line from the second gate driver.

17. The method of claim 11, further comprising forming an output node of the first gate driver, wherein the output node extends along the first direction from the first gate driver, crosses over and is insulated from the second portion of the storage electrode line.

18. The method of claim 17, further comprising connecting the output node to the gate line with a pixel electrode pattern.

19. The method of claim 11, wherein the storage electrode line extends in the second direction only in the non-display region.

20. The method of claim 11, wherein the storage electrode line does not extend in the second direction in the display region.

* * * * *